United States Patent
Komukai (10) Patent No.: US 10,877,372 B2
(45) Date of Patent: Dec. 29, 2020

(54) PATTERN FORMING METHOD AND SEMICONDUCTOR DEVICE MANUFACTURING METHOD

(71) Applicant: TOSHIBA MEMORY CORPORATION, Tokyo (JP)

(72) Inventor: Toshiaki Komukai, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 17 days.

(21) Appl. No.: 16/285,193

(22) Filed: Feb. 25, 2019

(65) Prior Publication Data
US 2020/0012187 A1    Jan. 9, 2020

(30) Foreign Application Priority Data

Jul. 6, 2018    (JP) .................................. 2018-128789

(51) Int. Cl.
| *H01L 21/033* | (2006.01) |
| *H01L 21/027* | (2006.01) |
| *G03F 7/00* | (2006.01) |

(52) U.S. Cl.
CPC ........ *G03F 7/0002* (2013.01); *H01L 21/0274* (2013.01); *H01L 21/0332* (2013.01); *H01L 21/0337* (2013.01)

(58) Field of Classification Search
CPC .............. G03F 7/0002; H01L 21/0332; H01L 21/0337; H01L 21/0274; H01L 21/31144
See application file for complete search history.

(56) References Cited

U.S. PATENT DOCUMENTS

| 9,793,120 B2 | 10/2017 | Nishimura et al. | |
| 10,118,317 B2 | 11/2018 | Kawamura et al. | |
| 2010/0092727 A1* | 4/2010 | Uchida | B29C 33/424 428/142 |
| 2010/0104984 A1* | 4/2010 | Shiobara | B82Y 40/00 430/319 |
| 2011/0012297 A1* | 1/2011 | Kobiki | B82Y 40/00 264/494 |
| 2013/0078821 A1* | 3/2013 | Furutono | B82Y 40/00 438/780 |
| 2018/0104888 A1* | 4/2018 | Ye | B29C 59/026 |

FOREIGN PATENT DOCUMENTS

| JP | S62-195125 A | 8/1987 |
| JP | 2012-054283 A | 3/2012 |
| JP | 2016-225370 A | 12/2016 |

* cited by examiner

*Primary Examiner* — Kyoung Lee
(74) *Attorney, Agent, or Firm* — Foley & Lardner LLP (57) ABSTRACT

A pattern forming method, including an imprinting process is provided. The method includes preparing a substrate having an organic film; forming a surface film, containing at least one of a metal or a semiconductor, in or on the surface of the organic film. The method further includes forming an inorganic film on the surface film; applying an organic mask material onto the inorganic film, and pressing a template having a fine pattern against the organic mask material to form a mask pattern; processing the inorganic film using the mask pattern as a mask; and removing the mask pattern. The organic mask material, when pressed by the template, is cured or solidified by being exposed to an ultraviolet light source. The solidified organic mask includes an overflow portion removable by plasma asking and exposing the surface film underneath.

12 Claims, 7 Drawing Sheets

PATTERN FORMING METHOD AND SEMICONDUCTOR DEVICE MANUFACTURING METHOD

CROSS-REFERENCE TO RELATED APPLICATION

This application is based upon and claims the benefit of priority from Japanese Patent Application No. 2018-128789, filed Jul. 6, 2018, the entire contents of which are incorporated herein by reference.

FIELD

Embodiments described herein relate generally to a pattern forming method and a semiconductor device manufacturing method.

BACKGROUND

An imprint method has been proposed as a method for forming a fine pattern in a semiconductor device manufacturing process. The imprint method involves dropping a resist on a film to be processed, and pressing a template, having a fine pattern formed thereon, against the resist to transfer the fine pattern of the template to the resist. Upon the pressing of the template, the resist can ooze or have an overflow portion beyond the periphery of the template, resulting in the formation of a protruding ooze or overflow defect.

A stacked mask structure is sometimes used in a semiconductor manufacturing process. In such a case, a fine pattern, which has been transferred to a resist, is sequentially transferred to the stacked mask structure while underlying films are processed. However, a resist ooze/overflown portion and an underlying portion of the stacked mask structure can cause contamination in a later process.

Examples of related art include Japanese Patent Laid-Open Publication No. 2016-225370.

DETAILED DESCRIPTION

Embodiments herein provide a pattern forming method and a semiconductor device manufacturing method which can prevent a resist ooze defect from causing contamination.

In general, according to one embodiment, a pattern forming method, including an imprinting process, comprises: preparing a substrate having an organic film; forming a surface film, containing at least one of a metal and a semiconductor, in or on the surface of the organic film; forming an inorganic film on the surface film; applying an organic mask material onto the inorganic film, and pressing a template having a fine pattern against the organic mask material to form a mask pattern; processing the inorganic film using the mask pattern as a mask; and removing the mask pattern.

Preferred embodiments will now be descried in detail with reference to the drawings. The embodiments are not to be construed as limiting the present disclosure. Further, it is understood that those equivalents or resemblances of the below-described components or elements, which are substantially the same as the components or elements or would be obvious to those of ordinary skill in the art, are within the scope of the present disclosure.

Embodiments of the present disclosure will be described with reference to FIGS. 1 through 7.

[Imprinting Process]

Figure 1:
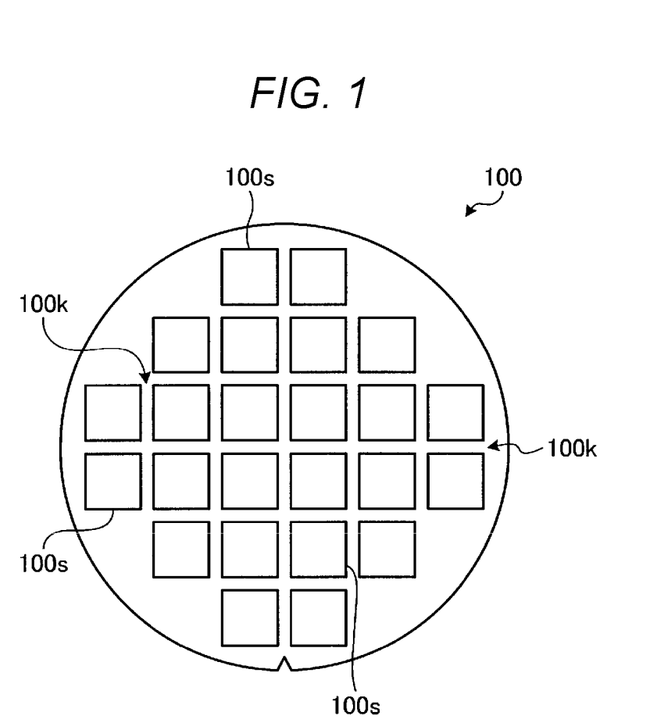
FIG. 1 is a diagram showing an example of the structure of a semiconductor substrate which is to be subjected to an imprinting process according to an embodiment.

FIG. 1 is a diagram showing an example of the structure of a semiconductor substrate which is to be subjected to an imprinting process according to an embodiment. A wafer 100 as a semiconductor substrate is divided into a plurality of shot areas 100s, and an imprinting process according to this embodiment is performed for each shot area 100s. The shot areas 100s are separated from each other by a kerf area 100k which lies between the shot areas 100s.

Figure 2A:
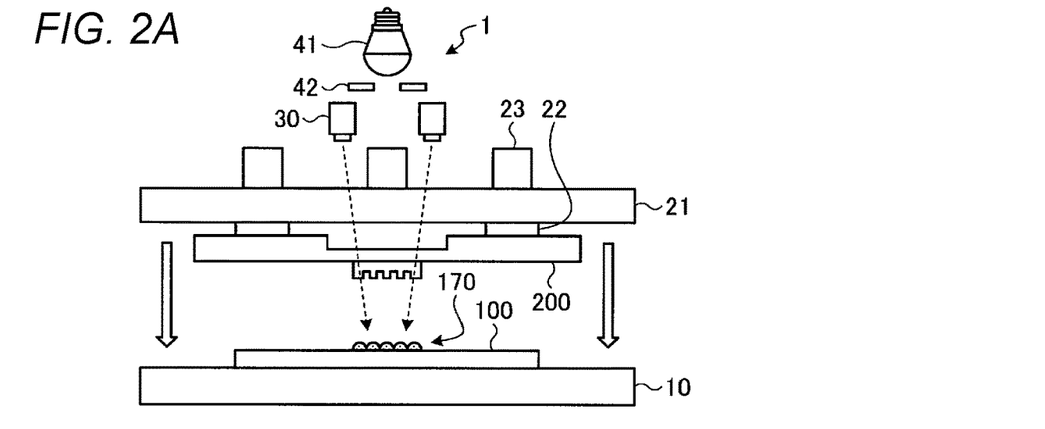
FIGS. 2A through 2C are flow diagrams illustrating an imprinting process according to the embodiment.
Figure 2B:
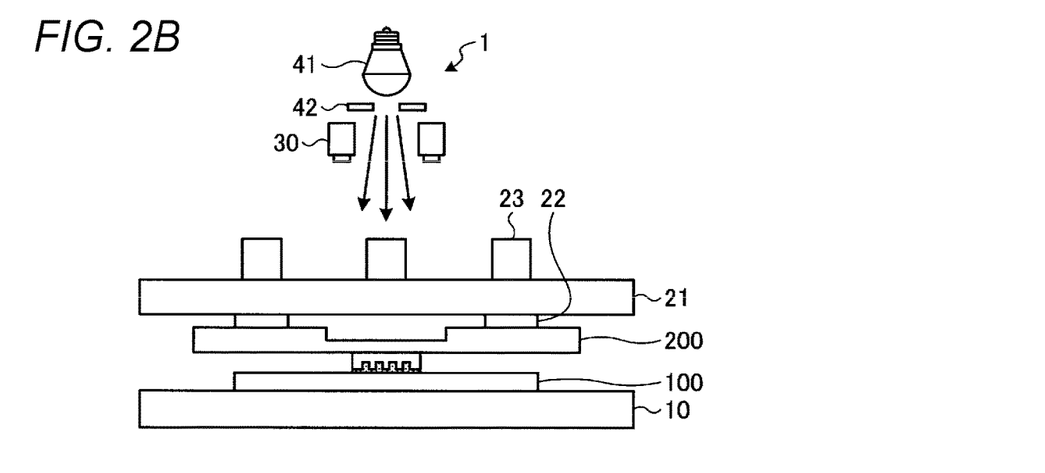
Figure 2C:
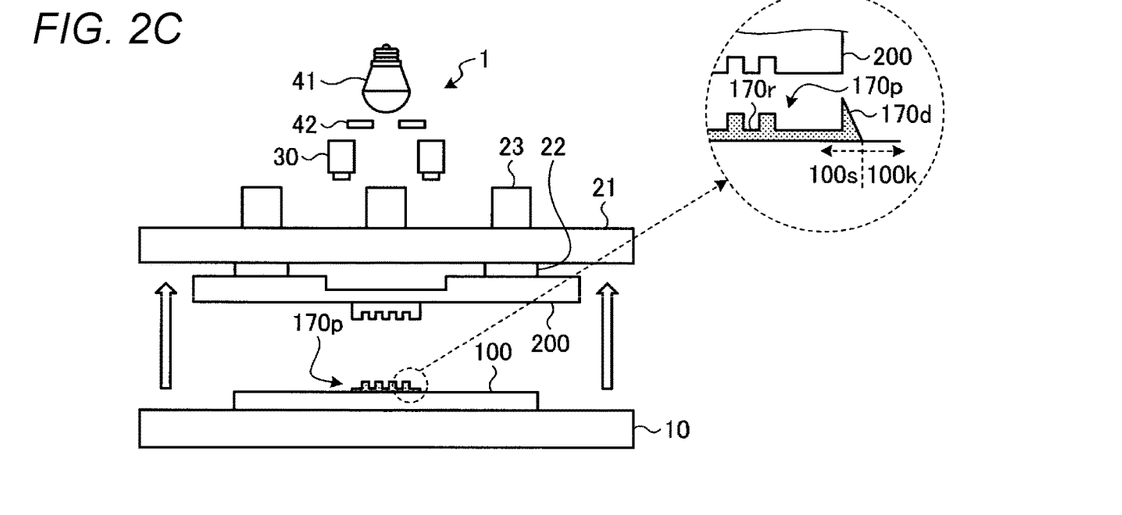

FIGS. 2A through 2C are flow diagrams illustrating an exemplary imprinting process according to this embodiment. The imprinting process can be performed, for example, in an imprinting apparatus 1.

As shown in FIG. 2, the imprinting apparatus 1 includes a wafer stage 10, a template stage 21, template chucks 22, pressing members 23, an aligner 30, a light source 41, and an aperture 42 to adjust an amount of radiation emitted by the light source.

The wafer 100 is placed on the wafer stage 10. A resist 170 in the form of liquid droplets has been dropped on a predetermined shot area of the wafer 100 by means of a not-shown resist supply section. The resist 170 is, for example, a photo-curable organic mask material. A template 200 is attached, with a fine pattern facing downward, to the template stage 21 by vacuum attraction through the template chucks 22. The template 200 is formed of a transparent material such as glass or crystal.

As shown in FIG. 2A, the wafer 100 is moved by the wafer stage 10 to a position under the template 200 held by the template stage 21. The aligner 30 detects the position of the wafer 100 and the position of the template 200 to adjust the positions.

As shown in FIG. 2B, the template stage 21 moves downward, and the template 200 comes into contact with the resist 170 on the wafer 100. The template stage 21 is pressed downward by the pressing members 23, whereby the template 200 is further pressed against the resist 170 on the wafer 100, while the template 200 is kept slightly away from the wafer 100 to avoid contact between them. When the template 200 is pressed against the resist 170, part of the resist 170 can sometimes ooze from the peripheral end of the template 200.

Subsequently, ultraviolet light, which has been emitted from the light source 41 and passed through the aperture 42, passes through a not-shown through via hole of the template stage 21 and transmits through the template 200, and irradiates the resist 170 on the wafer 100, thereby curing and/or solidifying the resist 170 (e.g. so as to harden the resist). An oozed or overflown portion of the resist 170 is also cured.

As shown in FIG. 2C, the template stage 21 moves upward, and the template 200 is detached from a resist pattern 170p on the wafer 100. The resist pattern 170p is the resist after the transfer of the fine pattern thereto and the subsequent curing. A remaining resist film 170r, which has been formed by the gap between the template 200 and the wafer 100 upon the pressing of the template 200, exists between the raised portions of the resist pattern 170p. Further, as described above, the resist pattern 170p can have a protruding ooze defect 170d produced in or near the kerf area 100k of the wafer 100, according to some embodiments.

Though in this example the template stage 21 is moved downward to press the template 200 against the wafer 100, it is possible to move the wafer stage 10 upward to press the wafer 100 against the template 200 so as to imprint the fine pattern of the template 200 on the resist 170 on the wafer 100.

[Pattern Forming Process]

Figure 3A:
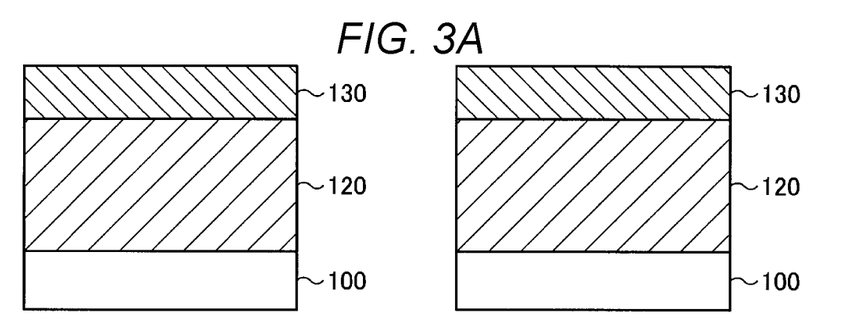
FIGS. 3A through 3C are flow diagrams illustrating a pattern forming process according to an embodiment.
Figure 3B:
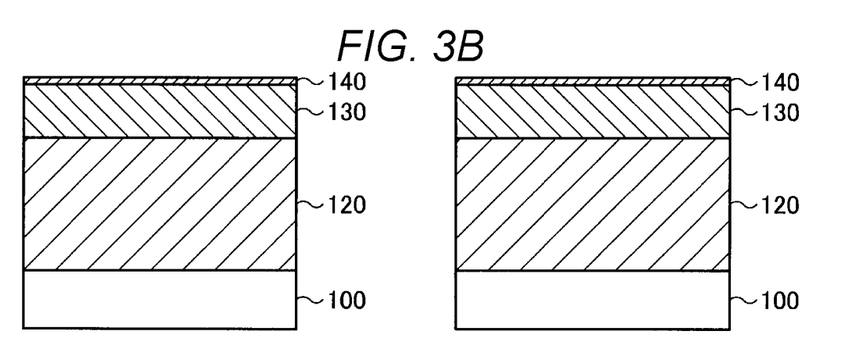
Figure 3C:
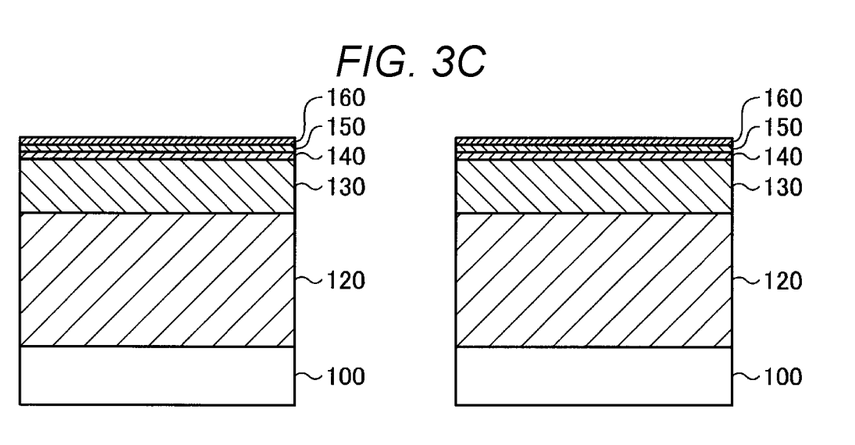
Figure 4A:
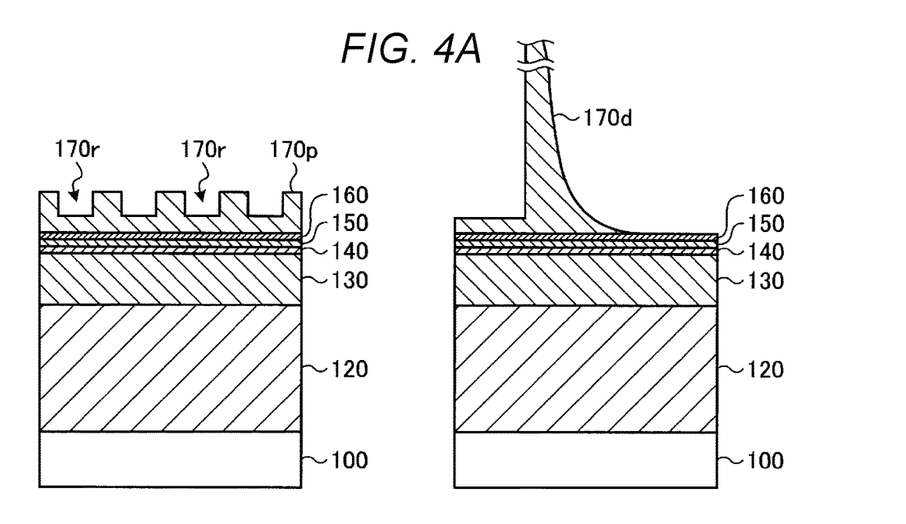
FIGS. 4A through 4C are flow diagrams illustrating the pattern forming process according to the embodiment.
Figure 4B:
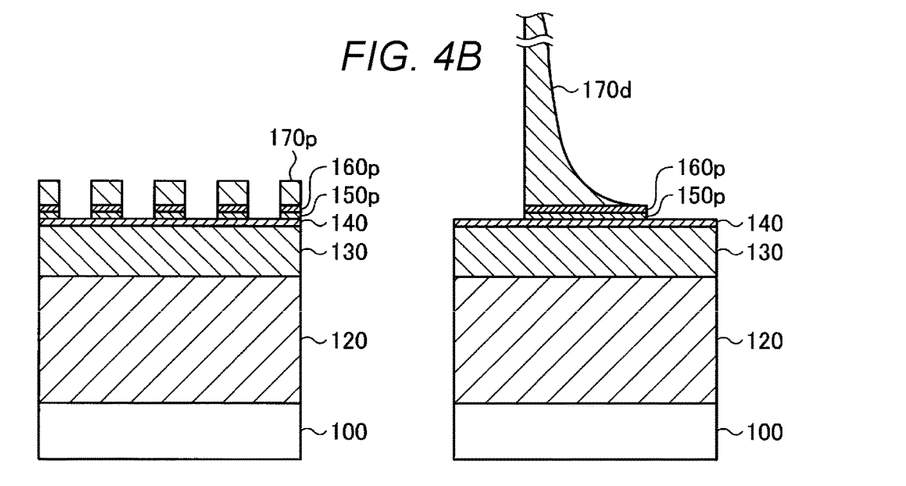
Figure 4C:
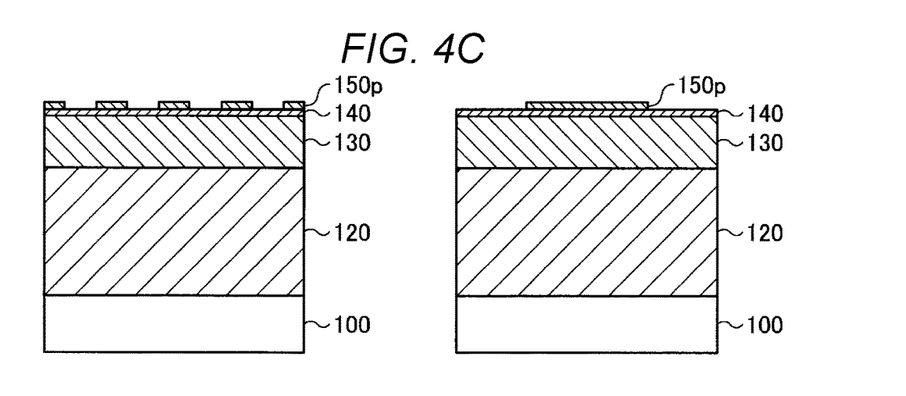

A pattern forming process as a semiconductor device manufacturing process according to an embodiment will now be described with reference to FIGS. 3 through 5. FIGS. 3 through 5 are flow diagrams illustrating a pattern forming process according to an embodiment. In FIGS. 3 through 5, the left-hand diagrams are cross-sectional views of the wafer 100 in a shot area 100s, while the right-hand diagrams are cross-sectional views of the wafer 100 in the kerf area 100k.

The pattern forming process of this embodiment mainly comprises stacking a Spin On Carbon (SOC) film 130, a Spin On Glass (SOG) film 150 and a resist pattern 170p in this order to form a stacked mask structure, and processing a to-be-processed film 120. According to such a stacked mask structure, a mask having a large thickness can be obtained by sequentially patterning the respective films by utilizing a difference in the etching resistance to various etching gases between the films.

First, as shown in FIG. 3A, the SOC (Spin On Carbon) film 130 as an organic film is formed on the to-be-processed film 120 formed on the wafer 100. The to-be-processed film 120 may be either a single-layer film such as a silicon oxide film or a silicon nitride film, or a stacked film comprising a stack of a plurality of such films.

Next, as shown in FIG. 3B, a tungsten film 140 as a surface film is formed on the surface of the SOC film 130. The tungsten film 140 is formed over the entire surface of the wafer 100 e.g. by a CVD (Chemical Vapor Deposition) method.

Next, as shown in FIG. 3C, the SOG (Spin On Glass) film 150 as an inorganic film is formed on the tungsten film 140 e.g. by spin coating. An adhesive film 160 is formed on the SOG film 150. The adhesive film 160 is, for example, an organic film containing, as an additive, a surfactant containing fluorine atoms or silicon atoms, a silane coupling agent, or the like. The adhesive film 160 enhances adhesion between an overlying resist film and the SOG film 150.

Subsequently, as shown in FIG. 4A, the resist pattern 170p as a mask pattern is formed on the adhesive film 160 by the above-described imprinting process. A remaining resist film 170r having a certain thickness exists between the raised portions of the resist pattern 170p. Assume that a resist ooze defect 170d is formed near the kerf area 100k.

Next, as shown in FIG. 4B, the remaining resist film 170r and the adhesive film 160, which lie between the raised portions of the resist pattern 170p, are removed. The adhesive film 160 becomes a patterned adhesive film 160p. Subsequently, the SOG film 150 is etched using the resist pattern 170p as a mask, thereby forming an SOG pattern 150p.

Next, as shown in FIG. 4C, the resist pattern 170p is removed by ashing using an oxygen plasma. The adhesive film 160 is also removed by the ashing. On the other hand, the SOC film 130, which is protected by the tungsten film 140, is not removed by the ashing.

Figure 5A:
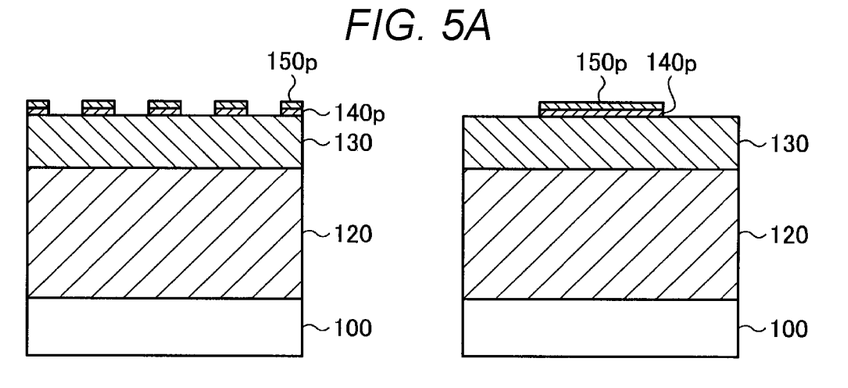
FIGS. 5A through 5D are flow diagrams illustrating the pattern forming process according to the embodiment.

Subsequently, as shown in FIG. 5A, the tungsten film 140, lying between the raised portions of the SOG pattern 150p, is removed. The tungsten film 140 becomes a patterned tungsten film 140p.

Figure 5B:
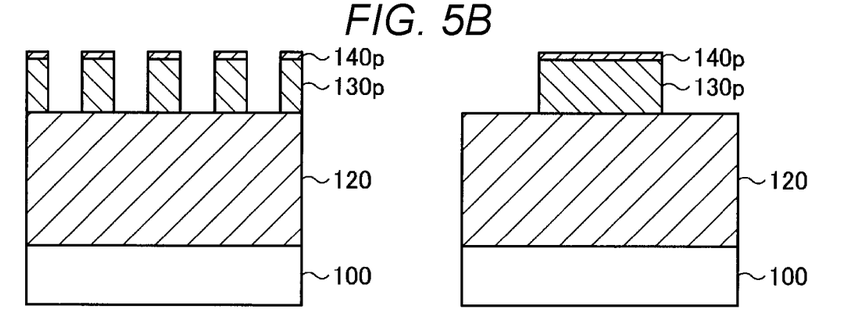

Next, as shown in FIG. 5B, the SOC film 130 is etched using the SOG pattern 150p as a mask, thereby forming an SOC pattern 130p. The film thickness of the SOG pattern 150p has been adjusted in advance so that the SOG pattern 150p will disappear after the formation of the SOC pattern 130p.

Figure 5C:
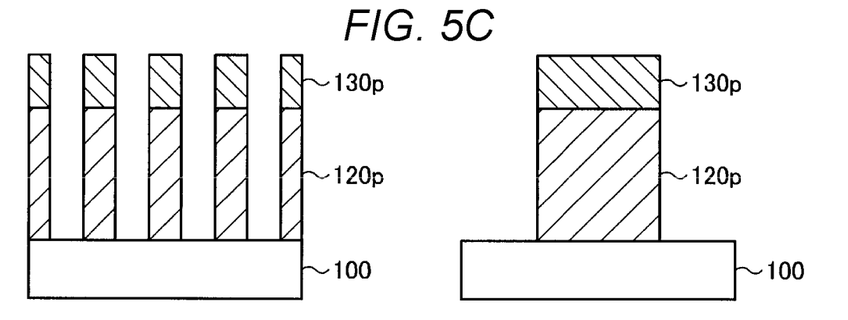

Next, as shown in FIG. 5C, the to-be-processed film 120 is etched using the SOC pattern 130p as a mask, thereby forming a patterned to-be-processed film 120p. The tungsten film 140p on the SOC pattern 130p is then removed. Alternatively, the thickness of the tungsten film 140p may be adjusted in advance so that the tungsten film 140p will disappear upon the etching of the to-be-processed film 120.

Figure 5D:
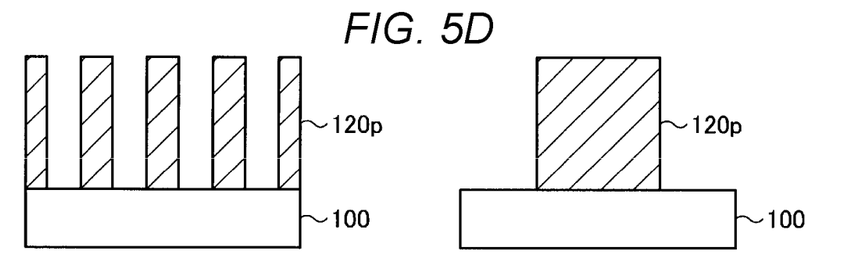

Next, as shown in FIG. 5D, the SOC pattern 130p is removed by ashing using an oxygen plasma, thereby completing the formation of the patterned to-be-processed film 120.

[Comparative Example]

The present inventors considered that the use of an SOC film in a stacked mask structure could provide a mask having a large thickness.

Figure 6A:
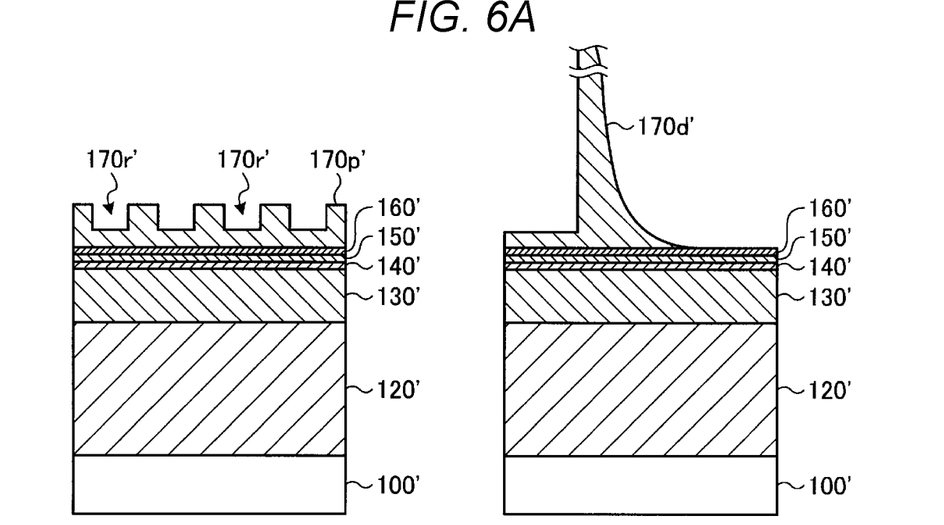
FIGS. 6A through 6C are flow diagrams illustrating a comparative pattern forming process.
Figure 6B:
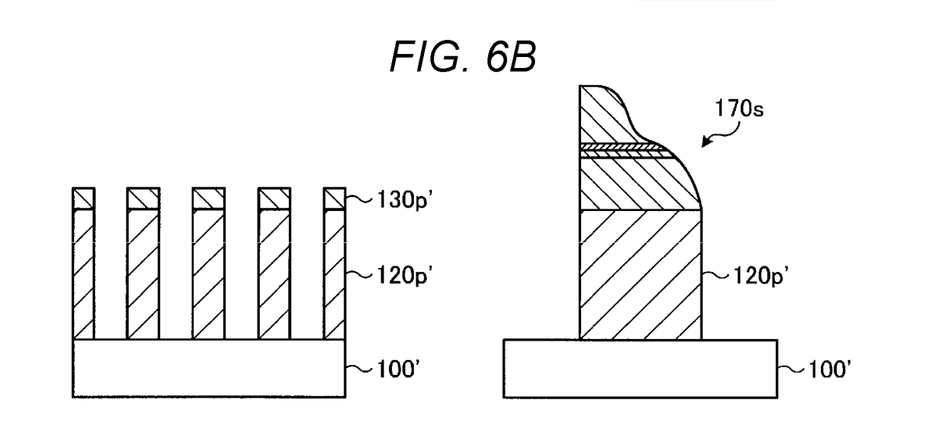
Figure 6C:
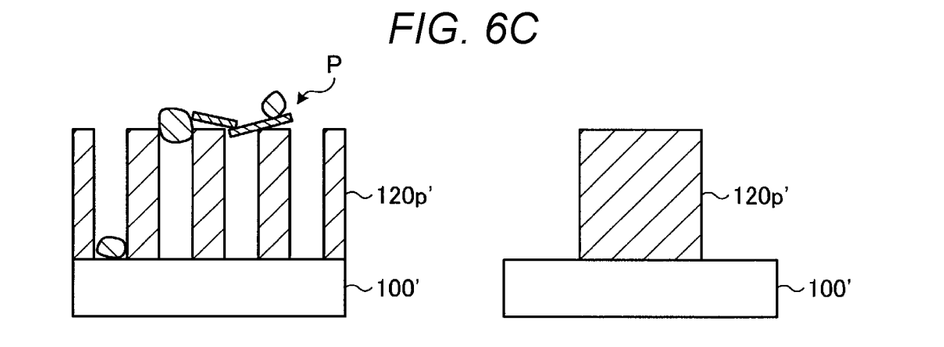

FIGS. 6A through 6C are flow diagrams illustrating a comparative pattern forming process in which an SOC film 130' is used in a stacked mask structure. In FIG. 6, the left-hand diagrams are cross-sectional views of a wafer 100' in a shot area, while the right-hand diagrams are cross-sectional views of the wafer 100' in a kerf area.

As shown in FIG. 6A, a to-be-processed film 120', an SOC film 130', an SOG film 150', an adhesive film 160', and a resist pattern 170p' are formed in this order on the wafer 100' in the comparative example. A resist ooze defect 170d' is formed near the kerf area 100k'. Thus, the present inventors first tried a comparative pattern forming process in which no tungsten film is formed on the SOC film 130'.

As shown in FIG. 6B, a remaining resist film 170r', the adhesive film 160', the SOG film 150', the SOC film 130', and the to-be-processed film 120' are sequentially patterned in this order, whereby a patterned to-be-processed film 120p' is obtained.

After the pattern forming process, a resist structure 170s, including the SOG film 150', is formed in or near the kerf area. The resist structure 170s protrudes to a height, e.g. on the order of hundreds of nm, which is several times higher than the height of the to-be-processed film 120p' formed in the shot area. It is therefore possible that the resist structure 170s may be scraped e.g. by a nail of a FOUP, which is used to handle the wafer 100', and may fly away and contaminate the wafer 100', the FOUP or the manufacturing apparatus.

Next, as shown in FIG. 6C, the resist pattern 170p' is removed by ashing using an oxygen plasma. The resist structure 170s, including the SOG film 150', may not be completely removed by the ashing, and part of the resist structure 170s may sometimes fly away in the form of particles P and contaminate the wafer 100' or the manufacturing apparatus.

Thus, it has been found that the use of the SOC film 130' in the stacked mask structure can provide a mask having a large thickness, but entails the drawback.

According to the pattern forming process of this embodiment, oxygen plasma ashing is performed after the formation of the SOG pattern 150p. The tungsten film 140, formed on the surface of the SOC film 130, can prevent the SOC film 130 from being removed by the oxygen plasma ashing even though it is performed at this stage. The oxygen plasma ashing can remove the resist ooze defect 170d before processing of layers underlying the SOG pattern 150p. There is, therefore, no formation of the resist structure 170s including the SOG film 150'. Accordingly, there is no fear of contamination caused by the resist structure 170s.

According to the pattern forming process of this embodiment, the SOC film 130 can be introduced into the stacked mask structure, without any fair of contamination, to obtain a mask having a large thickness. Further, the presence of the tungsten film 140 on the SOC film 130 can further enhance the etching resistance of the mask. This can enhance the accuracy of processing of the to-be-processed film 120.

The pattern forming process of this embodiment can introduce the SOC film 130, having a large thickness, into the stacked mask structure, and yet can prevent breakage of the template 200, caused e.g. by particles on the wafer 100, thereby extending the life of the template 200.

[Variation]

Figure 7A:
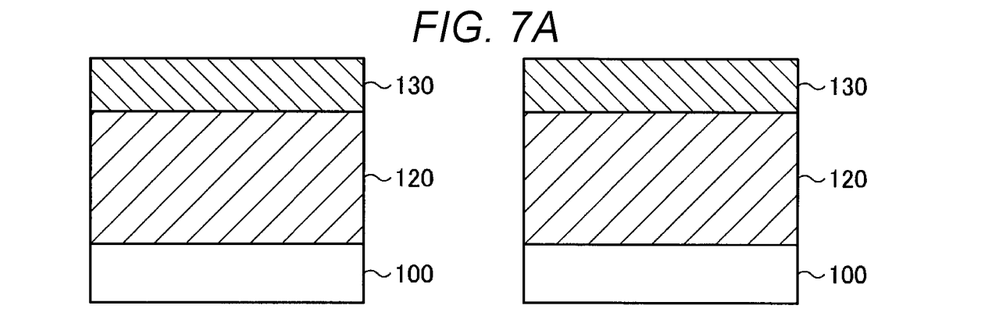
FIGS. 7A through 7C are flow diagrams illustrating a pattern forming process according to a variation of the embodiment.
Figure 7B:
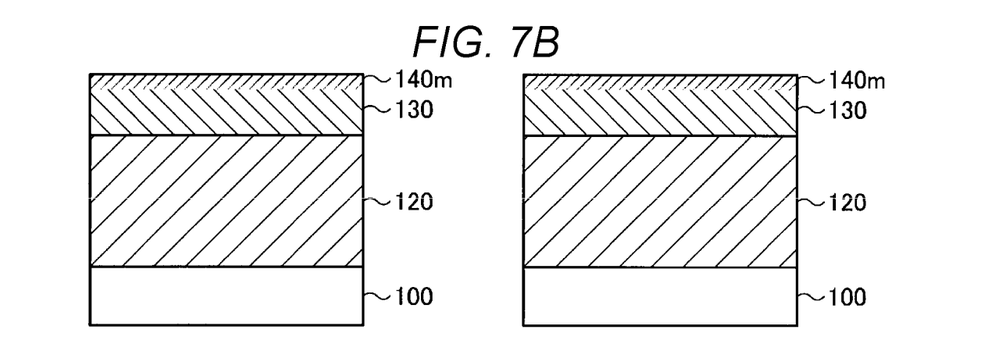
Figure 7C:
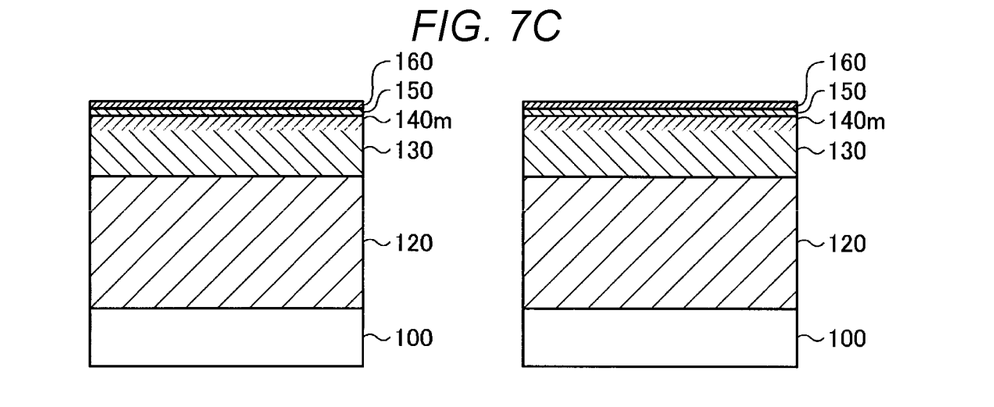

A pattern forming process according to a variation of the above-described embodiment will now be described with reference to FIG. 7. FIGS. 7A through 7C are flow diagrams illustrating a pattern forming process according to the variation. In FIG. 7, the left-hand diagrams are cross-sectional views of a wafer 100 in a shot area, while the right-hand diagrams are cross-sectional views of the wafer 100 in a kerf area. The pattern forming process of this variation differs from that of the above-described embodiment in that the SOC film 130 is metallized to form a surface film.

First, as shown in FIG. 7A, an SOC film 130 as an organic film is formed on a to-be-processed film 120 formed on the wafer 100.

Next, as shown in FIG. 7B, a metal-impregnated film 140m as a surface film is formed in the surface of the SOC film 130. The metal-impregnated film 140m is formed over the entire surface of the wafer 100 e.g. by metalizing the SOC film 130.

A precursor such as $WCl_6$, which is used e.g. in CVD or ALD (Atomic Layer Deposition), is employed in the metallization of the SOC film 130. For example, the SOC film 130 is exposed to $WCl_6$ as a precursor in a vacuum atmosphere, whereby $WCl_6$ is adsorbed onto a structure having an electron pair, such as a carbonyl group or a cyano group, contained in a polymer in the SOC film 130. When the SOC film 130 is then oxidized by exposing it e.g. to steam, a metal compound such as tungsten oxide, or elemental tungsten precipitates in the SOC film 130. The SOC film 130 is thus metallized.

As used herein, the term "metallization" refers to the operation of impregnating the SOC film 130 with a precursor such as $WCl_6$, and causing an elemental metal or a metal compound to precipitate in the SOC film 130. The film thus formed is referred to as the metal-impregnated film (metallized film) 140m. The metal-impregnated film 140m is formed in a surface region of the SOC film 130. Thus, the metal-impregnated film 140m is formed integrally with the SOC film 130 and has no clear interface with the SOC film 130. The metal or metal compound in the metal-impregnated film 140m has a concentration gradient in the thickness direction, and the concentration is highest in a surface region of the metal-impregnated film 140m, i.e. at the surface of the SOC film 130.

Next, as shown in FIG. 7C, an SOG film 150 is formed on the metal-impregnated film 140m e. g. by spin coating. An adhesive film 160 is formed on the SOG film 150. The subsequent process steps are the same as the pattern forming process of the above-described embodiment.

The pattern forming process of this variation achieves the same effect as the pattern forming process of the above-described embodiment.

Further, according to the pattern forming process of this variation, the metal-impregnated film 140m has no clear interface with the SOC film 130. This prevents peeling of the metal-impregnated film 140m from the SOC film 130. Further, the thickness of the metal-impregnated film 140m can be made large without any fear of peeling of the metal-impregnated film 140m from the SOC film 130.

[Other Variations]

Though in the above-described embodiment the tungsten film 140 is used as a surface film, it is possible to use any surface film that can be formed by CVD and is resistant to an ashing plasma. Examples of usable surfaces films may include a tungsten film, a tungsten silicide film, a titanium film, and a titanium nitride film.

Though in the above-described variation the metal-impregnated film 140m containing tungsten is used as a surface film, it is possible to use any surface film that can be formed by metallization of an organic film such as the SOC film 130 and is resistant to an ashing plasma. Such a metal-impregnated film may contain a metal such as tungsten, aluminum, titanium, zinc, vanadium, hafnium, zirconium, tantalum, or molybdenum. Such a metal-impregnated film may contain a semiconductor atom such as silicon or germanium. An organic metal compound or a halide of such a metal can be used as a precursor. Examples of usable precursors include $AlCl_3$, $TiCl_4$, $ZnCl_2$, $WCl_6$, $VCl_4$, $HfCl_4$, $ZrCl_4$, and trimethylaluminum (TMA). The organic film can be metallized by exposing it to such a precursor in a gas phase or a liquid phase. A metal oxide or an elemental metal, deriving from the precursor, precipitates in the organic film. Examples of the precipitate in the organic film may include $AlO_x$, $TiO_x$, ZnO, $ZrO_x$, $HfO_x$, and $SiO_x$.

Though in the above-described embodiments the resist pattern 170p is removed by ashing using an oxygen plasma, it is possible to use some other ashing plasma such as a CO plasma, a nitrogen plasma, or a hydrogen plasma.

Though in the above-described embodiments the stacked mask structure is composed mainly of the SOC film 130, the SOG film 150 and the resist pattern 170p, some other organic film may be used instead of the SOC film 130. Some other inorganic film, such as a low temperature oxide (LTO) film or a low temperature nitride film, may be used instead of the SOG film 150. Various other stacked mask structures, which are obtained by inserting some other film(s) into the above-described structure and/or deleting some film(s) from the above-described structure, may be employed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method including an imprinting process, comprising:
   preparing a substrate having an organic film;
   forming a surface film, containing at least one of a metal or a semiconductor, in or on a surface of the organic film;
   forming an inorganic film on the surface film;
   applying an organic mask material onto the inorganic film;
   pressing a template having a pattern against the organic mask material to form a mask pattern;
   processing the inorganic film using the mask pattern as a mask; and
   removing the mask pattern.

2. The pattern forming method according to claim 1, wherein forming the surface film comprises forming a metal film on the organic film by a chemical vapor deposition method.

3. The pattern forming method according to claim 1, wherein forming the surface film comprises impregnating the surface of the organic film with at least one of a metal element or a semiconductor element.

4. The pattern forming method according to claim 3, wherein removing the mask pattern comprises removing the mask pattern by plasma ashing.

5. The pattern forming method according to claim 4, wherein forming the surface film comprises forming the surface film over an entire surface of the substrate, the entire surface being divisible into a plurality of shot areas; and wherein the mask pattern is formed for each of the plurality of shot areas into which the substrate is divided.

6. The pattern forming method according to claim 1, wherein pressing the template having the pattern against the organic mask material to form the mask pattern further comprises curing the organic mask material from a non-solid state into a solid state.

7. The pattern forming method according to claim 6, wherein pressing the template having the pattern against the organic mask material to form the mask pattern further comprises squeezing the organic mask material outside of the pattern to form an overflow portion, the overflow portion being within a shot area and defining an edge of a kerf area next to the shot area, and wherein the overflow portion over the surface film is removable by plasma ashing while the surface film resists plasma ashing.

8. The pattern forming method according to claim 1, wherein forming the surface film further comprises forming the surface film using chemical vapor deposition.

9. A semiconductor device manufacturing method including an imprinting process, comprising:
   preparing a semiconductor substrate having an organic film;
   forming a surface film, the surface film containing at least one of a metal or a semiconductor, in or on the surface of the organic film;
   forming an inorganic film on the surface film;
   applying an organic mask material onto the inorganic film;
   pressing a template having a pattern against the organic mask material to form a mask pattern;
   processing the inorganic film using the mask pattern as a mask; and
   removing the mask pattern.

10. The semiconductor device manufacturing method of claim 9, wherein pressing the template having the fine pattern against the organic mask material to form the mask pattern further comprises curing the organic mask material from a non-solid state into a solid state.

11. The semiconductor device manufacturing method of claim 10, wherein pressing the template having the pattern against the organic mask material to form the mask pattern further comprises squeezing the organic mask material outside of the fine pattern to form an overflow portion, the overflow portion being within a shot area and defining an edge of a kerf area next to the shot area, wherein the overflow portion is removable by plasma ashing while the surface film resists plasma ashing.

12. The semiconductor device manufacturing method of claim 9, wherein forming the surface film further comprises forming the surface film using chemical vapor deposition.

* * * * *